(12) United States Patent
Hailey et al.

(10) Patent No.: US 6,507,495 B1
(45) Date of Patent: Jan. 14, 2003

(54) THREE-DIMENSIONAL TECHNIQUE FOR IMPROVING THE EMC CHARACTERISTICS OF A PRINTED CIRCUIT BOARD

(75) Inventors: Jeffery C. Hailey, Austin; Donald L. Brooks, Round Rock, both of TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/605,448

(22) Filed: Jun. 28, 2000

(51) Int. Cl.$^7$ ................................................. H05K 7/02
(52) U.S. Cl. ....................... 361/748; 361/794; 361/784; 361/803; 333/246; 333/247; 174/250; 174/261; 174/262
(58) Field of Search ................................. 361/748, 780, 361/794, 784, 803; 333/246, 247, 12; 174/250, 261, 262

(56) References Cited

U.S. PATENT DOCUMENTS

| | | | |
|---|---|---|---|
| 4,843,191 A | * 6/1989 | Thomas | 174/88 R |
| 5,912,809 A | 6/1999 | Steigerwald et al. | 361/780 |
| 5,955,704 A | 9/1999 | Jones et al. | 174/262 |
| 6,175,493 B1 | * 1/2001 | Gold | 361/687 |
| 6,180,976 B1 | * 1/2001 | Roy | 257/306 |
| 6,219,255 B1 | * 4/2001 | Teshome | 361/794 |

OTHER PUBLICATIONS

Hailey, Jeff; Steigerwald, "Digital Circuit Decoupling For EMI Reduction," Jan. 25, 2000; U.S. Application No.: 09/491,290. (Copy not enclosed).

Hailey, Jeff, "Improving The EMC Characteristics Of A Printed Circuit Board," Sep. 21, 1999, U.S. Application No.: 09/400,025. (Copy not enlcosed).

Sebring, Mitchell; Steigerwald, Todd, "Circuit Board Voltage Plane Impedance Matching," Jan. 25, 1999; U.S. Application No.: 09/236,706. (Copy not enclosed).

\* cited by examiner

*Primary Examiner*—David Martin
*Assistant Examiner*—Hung Bui
(74) *Attorney, Agent, or Firm*—Baker Botts L.L.P.

(57) ABSTRACT

An apparatus for use with data processing systems. In one embodiment, the apparatus includes but is not limited to at least one conductive member having a first end electrically coupled to a first conductive structure which partially forms a moat and a second end electrically coupled to a second conductive structure which substantially spans the moat, with the second conductive structure having at least a part overhanging a third conductive structure which partially forms the moat. In one embodiment, the apparatus includes but is not limited to a first conductive member having a first end electrically coupled to a first conductive structure which partially forms a moat and a second end electrically coupled to a second conductive structure which substantially spans the moat, with the second conductive structure having at least a part overhanging a third conductive structure which partially forms the moat, and a second conductive member having a first end electrically coupled to the third conductive structure which partially forms the moat and a second end electrically coupled to a fourth conductive structure which substantially spans the moat, with the fourth conductive structure having at least a part overhanging the first conductive structure which partially forms the moat.

44 Claims, 5 Drawing Sheets

THREE-DIMENSIONAL TECHNIQUE FOR IMPROVING THE EMC CHARACTERISTICS OF A PRINTED CIRCUIT BOARD

BACKGROUND OF THE INVENTION

1. Field of the Invention

The present invention relates, in general, to data processing systems having printed circuit boards.

2. Description of the Related Art

A printed circuit board is a "board" made of at least one layer of conducting material (e.g., copper or aluminum) laminated together with at least one layer of non-conducting material (e.g., plastic, glass, ceramic, or some other dielectric). In practice, the conducting material is usually (but not always) etched away in various locations in order to create one or more conducting traces which are subsequently used to provide electrical connection between integrated circuits and/or other electronics mounted on the printed circuit board.

A multilayer printed circuit board is a printed circuit board having two or more conducting layers of board material, where at least one non-conducting layer is interposed between each pair of conducting layers. In a multilayer printed circuit board, each separate conducting layer typically (but not always) has at least one conducting element providing electrical connection with at least one other conducting layer. In multilayer printed circuit boards, the conducting and non-conducting layers are generally laminated together in an alternating fashion in order to produce a single circuit board to which components, such as integrated circuits, resistors, and capacitors are attached.

One common multilayer printed circuit board scenario is to have alternating layers, where a first layer is composed in all or part of conducting materials, a second layer is composed mostly of insulating material, and a third layer is composed in all or art of conducting materials, with portions of the conducting materials in the first and third layer connected by conducting materials interposed within channels within the second insulating layer. Such first, second, and third layers typically form part or all of an electric circuit. Many such alternating layers are often used to construct a final circuit.

With reference now to FIG. 1, shown is a perspective view of a grossly simplified example of alternating layers within a multilayer printed circuit board which form equivalent electric circuit 150. Depicted is that equivalent electric circuit 150 has a current loop 152 from driver 102 to receiver 106. Current loop 152 travels an electrically conductive path provided by multilayer printed circuit board structure 154. Multilayer printed circuit board structure 154 depicts driver 102, metallic trace 104, and receiver 106 which are contained within a first layer (not shown) of printed circuit board structure 154. Driver 102 is illustrated as electrically connected to metallic trace 104 (e.g., a copper trace). Metallic trace 104 is shown electrically connected to receiver 106. Receiver 106 is depicted as electrically connected to metallic wire 112. Metallic wire 112 is depicted as electrically connected at point 162 with conducting plane 116. Conducting plane 116 is illustrated as electrically connected at point 164 to metallic wire 118. Metallic wire 112 and metallic wire 118 are generally contained within a cylindrical channel hollowed out from a second insulating layer (not shown) of printed circuit board structure 154, and constitute examples of what are generally referred to as "vias" within the art. For sake of illustration and coordination with equivalent electrical circuit 150, electrical current loop 152 is shown flowing from driver 102 to receiver 106 through metallic trace 104. Thereafter, electrical current loop 152 is shown flowing through metallic wire 112, metallic conducting plane 116, and metallic wire 118 back to driver 102.

Referring now to FIG. 2A, depicted is an isolated perspective view of metallic conducting plane 116 and metallic trace 104 of FIG. 1. As has been described, metallic wires 112, 118 (of FIG. 1) respectively electrically connect with conducting plane 116 at points 162, 164 on conducting plane 116 which are shown relatively "in line" with metallic trace 104. Viewed from the perspective of conducting plane 116, when relatively high frequency alternating current (e.g., current with frequencies substantially in excess of 10 kHz) is flowing in current loop 152 (of FIG. 1), metallic wires 112, 118 (of FIG. 1) are respectively sourcing and sinking current into points 162, 164 on conducting plane 116. Insofar as conducting plane 116 typically has relatively uniform characteristics, return current 160, flowing between point 162 to point 164, will tend to follow a path substantially underneath metallic trace 104, since for relatively high frequency alternating current the path underneath metallic trace 104 is the path of least impedance for reasons well-known to those in the art. The magnitude of return current 160 will be substantially the same as that of source current 159, since together source current 159 and return current 160 make up loop current 152. However, since conducting plane 116 is of greater width physical width than metallic trace 104, although the majority of return current 160 will attempt to flow under metallic trace 104, in actuality it will be distributed across width 170 of conducting plane 116 in a fashion illustrated by FIG. 2B.

With reference now to FIG. 2B, illustrated is an example of distribution 161 of return current 160 (of FIGS. 1 and 2A) on conducting plane 116. Shown is that the majority of return current 160 (of FIGS. 1 and 2A) is distributed, or flowing, through the portion of conducting plane 116 which lies substantially directly below metallic trace 104.

Referring again to FIG. 1, those skilled in the art will recognize that it is not necessary for metallic wires 112, 118 to be present in order for a return current to be present on conducting plane 116. That is, the mere presence of an alternating current in metallic trace 104 proximate to conducting plane 116 is sufficient to induce a return current such as return current 160. See e.g., M. Zahn, *Electromagnetic Field Theory: A Problem Solving Approach* 361–363 (1979). Furthermore, in point of fact, in an actual implementation it is likely that both current resulting from metallic wires 112, 118 and from electromagnetic coupling will be present on conducting plane 116. However, for ease of description the discussion herein focuses on the current resulting from the presence of metallic wires 112, 118, although it is to be understood that in addition to or in the alternative to such current resulting from the presence of metallic wires connecting at points 162, 164, a return current can be present arising solely from the presence of electromagnetic coupling arising from alternating current within metallic trace 104, when metallic trace 104 is located proximate to conducting plane 116. This fact is to be borne in mind whenever discussion is made of any return current described in the present application.

Unfortunately, as printed circuit board densities have increased, the structure illustrated in FIGS. 1, 2A, and 2B is becoming less and less practicable. Instead, it is becoming common within the art for conducting plane 116 to be split into two pieces, for a variety of reasons. Splitting conducting plane 116 gives rise to a number of practical problems, a few of which will now be described.

Referring now to FIG. 3, shown is a modified version of multilayer printed circuit board structure 154, referred to as multilayer printed circuit board structure 300, which is structurally similar to printed circuit board structure 154 except that the conducting plane is shown broken into first metallic conducting part 302 and second metallic conducting part 304, thereby forming split conducting plane 316. Depicted is that first metallic conducting part 302 and second metallic conducting part 304 are separated by dielectric-filled moat 306 which is typically composed of a dielectric material. Shown is that metallic wires 112, 118 respectively connect with split conducting plane 316 at points 362, 364 on split conducting plane 316.

Those skilled in the art will recognize that even though there is no contiguous return path from receiver 106 to driver 102 through split conducting plane 316, driver 102 and receiver 106 will still function because second metallic conducting part 304 and first metallic conducting part 302 function as a sort of "parallel-plate" capacitor. This fact is illustrated by loop current 352 in equivalent electric circuit 350, wherein first metallic conducting part 302 and second metallic conducting part 304 separated by dielectric-filled moat 306 is represented by capacitor 353. Further shown is that loop current 352 can be viewed as composed of a source current 359 and a return current 360, each having substantially equal magnitude (since they make up loop current 352) but different distributions within their respective current flow paths.

Those skilled in the art will recognize that there are government (e.g., the Federal Communications Commission in the United States) and industry electromagnetic compatibility (EMC) standards which set limits on the amount of electromagnetic radiation which may emanate from electrical systems having integrated circuits. As will be described in the detailed description, it has been discovered that split conducting plane 316 composed of first metallic conducting part 302, and dielectric-filled moat 306, and second metallic conducting part 304 of multilayer printed circuit board structure 300 tends to radiate a substantial amount of electromagnetic energy above and beyond that radiated by metallic conducting layer 116 of multilayer printed circuit board structure 300 (which for all practical purposes amounts to almost zero radiated electromagnetic energy compared to that radiated by the foregoing described structure of multilayer printed circuit board structure 300). Insofar as the government and industry standards are aggregative, it is desirable that each printed circuit board component radiate as little electromagnetic energy as possible, because the smallest increase in radiated energy can often make the difference between passing and failing compliance standards. Such radiated energy is commonly referred to in the art as electromagnetic interference ("EMI").

Related art attempts to solve the noted radiation problem have primarily consisted of placing a discrete capacitor on a outermost layer of a multilayer printed circuit board such that the discrete capacitor connects both halves of the split conducting plane. The inventors named herein have noticed, and such noticing forms part of the inventive content herein, that such related art solutions have associated with them disadvantages including the cost of the discrete capacitor, the board real-estate consumed by the discrete capacitor, and the relatively high inductance associated with vias necessary to connect a discrete capacitor on an outermost board layers with conducting layers internal to the board. In light of the of the foregoing, it the inventors have posited that it would be beneficial to decrease the electromagnetic energy radiated from split metallic conductors carrying electrical energy in a way that avoids the disadvantages associated with the use of discrete capacitors in the related art.

SUMMARY OF THE INVENTION

It has been discovered that an apparatus can be produced which will substantially decrease radiated emissions from split metallic conductors carrying electrical energy. In one embodiment, the apparatus includes but is not limited to at least one conductive member having a first end electrically coupled to a first conductive structure which partially forms a moat and a second end electrically coupled to a second conductive structure which substantially spans the moat, with the second conductive structure having at least a part overhanging a third conductive structure which partially forms the moat.

In one embodiment, the apparatus includes but is not limited to a first conductive member having a first end electrically coupled to a first conductive structure which partially forms a moat and a second end electrically coupled to a second conductive structure which substantially spans the moat, with the second conductive structure having at least a part overhanging a third conductive structure which partially forms the moat, and a second conductive member having a first end electrically coupled to the third conductive structure which partially forms the moat and a second end electrically coupled to a fourth conductive structure which substantially spans the moat, with the fourth conductive structure having at least a part overhanging the first conductive structure which partially forms the moat.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the independent invention(s) described herein. The description is intended to be illustrative and should not be taken to be limiting.

Figure 4:
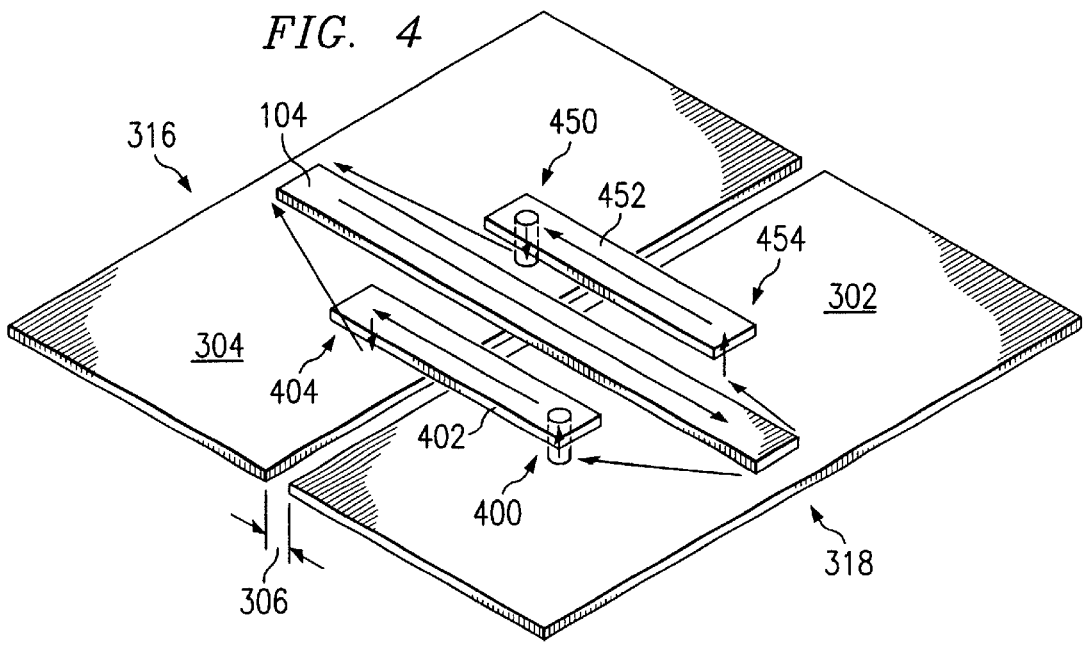
FIG. 4 depicts first half 490 of split conducting plane 316 to which has been joined conductive via 400.

With reference now to FIG. 4, depicted is first metallic conducting part 302 of split conducting plane 316 to which has been joined conductive via 400. Illustrated is that conductive via 400 (although vias are described herein, it is to be recognized that such structures are intended to be exemplary of any conductive elements providing electrical connection between electrically conductive items (e.g., traces) separated by a dielectric) is further joined with conductive subplane 402 which is not coplanar with split conducting plane 316, but which in one embodiment is coplanar with metallic trace 104 (which is assumed to be carrying source current 359). Shown is that conductive subplane 402 is such that it spans dielectric-filled moat 306 and such that it forms an "island" which can be "projected" down onto split conducting plane 316 to form "image" 404 on second metallic conducting part 304 of split conducting plane 316.

It has been found empirically that the portion of conductive subplane 402, which overhangs second metallic conducting part 304 of split conducting plane 316, can be treated as a capacitor whose capacitance in farads is roughly given by the equation "$C=(\epsilon \times A) \div d$" —where $\epsilon$ is the permittivity in farads/meter of the dielectric separating the conducting plates, A is the area in meters of the "island," or image 404, and d is the distance in meters separating conductive subplane 402. The impedance Z of the capacitor so formed is roughly given by the relation "$Z=1/(j\omega C)$," where $\omega$ is angular frequency in radians/second, and C is capacitance in farads. Thus, by increasing the area A or decreasing the separation d, the capacitance can be increased and thus the impedance reduced; consequently, the electromagnetic radiation associated with the impedance is reduced.

Further shown in FIG. 4 is second metallic conducting part 304 of split conducting plane 316 to which has been joined conductive via 450. Illustrated is that conductive via 450 is further joined with conductive subplane 452 which is not coplanar with split conducting plane 316, but which in one embodiment is coplanar with metallic trace 104. Shown is that conductive subplane 452 is such that it spans dielectric-filled moat 306 and such that it forms an "island" which can be "projected" down onto split conducting plane 316 to form "image" 454 on first metallic conducting part 302 of split conducting plane 316.

It has been found empirically that conductive subplane 452 which overhangs first metallic conducting part 302 and split conducting plane 316 can be treated as a capacitor whose capacitance in farads is roughly given by the equation "$C=(\epsilon \times A) \div d$" —where $\epsilon$ is the permittivity in farads/meter of the dielectric separating the conducting plates, A is the area in meters of the "island," or image 454, and d is the distance in meters separating conductive subplane 452. The impedance Z of the capacitor so formed is roughly given by the relation "$Z=1/(j\omega C)$," where $\omega$ is angular frequency in radians/second, and C is capacitance in farads. Thus, by increasing the area A or decreasing the separation d, the capacitance can be increased, and thus the impedance reduced; consequently, the electromagnetic radiation associated with the impedance is reduced.

It will be noted that subplanes 402 and 452, and their associated conductive vias 400 and 450, are depicted as formed with substantially similar shapes and substantially symmetrical locations about metallic trace 104. It is not necessary for both subplanes and their associated conductive vias to always be present, but it has been found in at least one embodiment that the symmetrical structure pictured provides an added advantage of EMI associated with what is known in the are as "common mode" current, which can manifest itself as current flowing in the reverse direction of standard loop currents.

Figure 1:
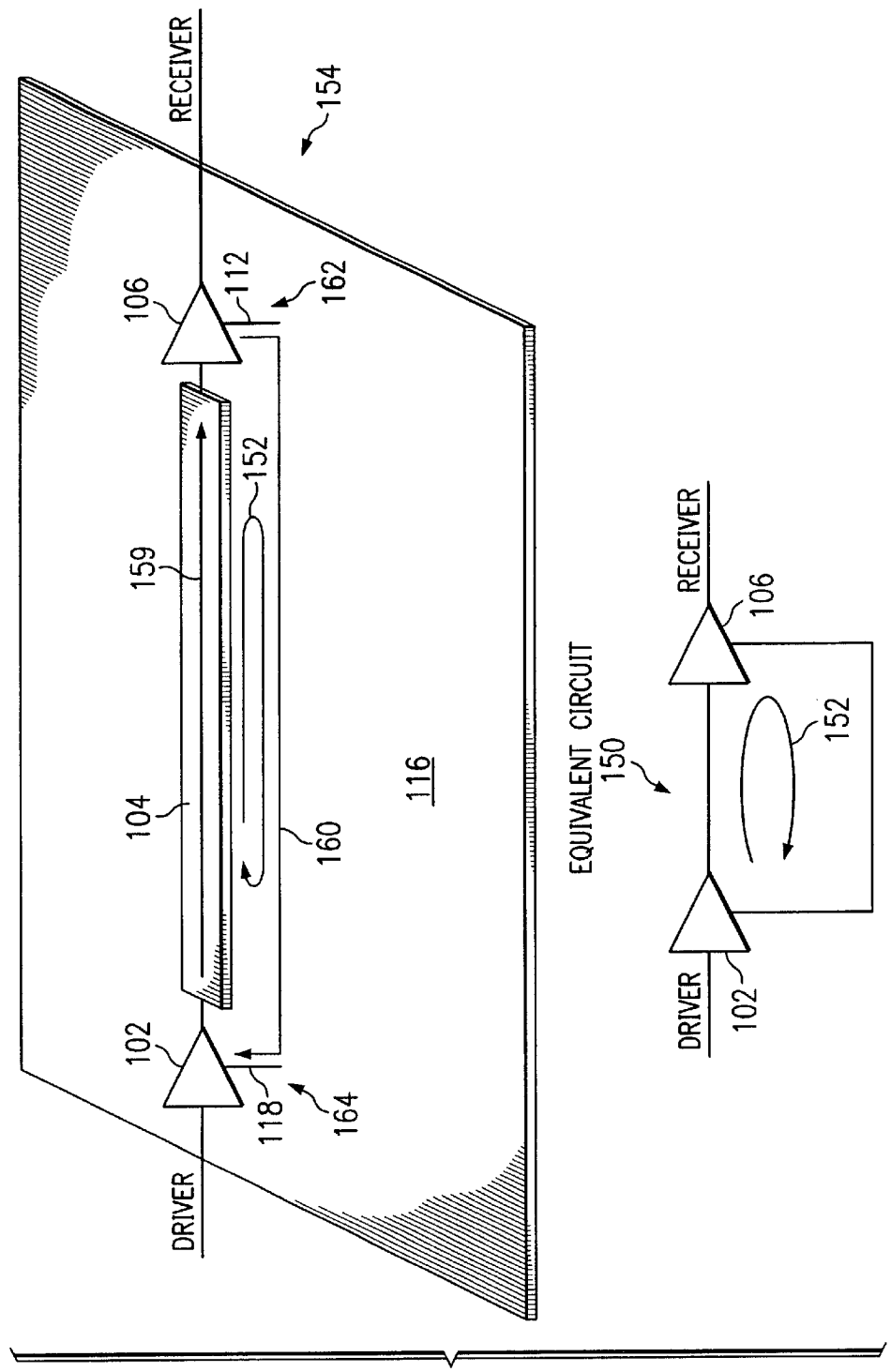
FIG. 1 shows a perspective view of a grossly simplified example of alternating layers within an multilayer printed circuit which forms equivalent electric circuit 150.
Figure 2A:
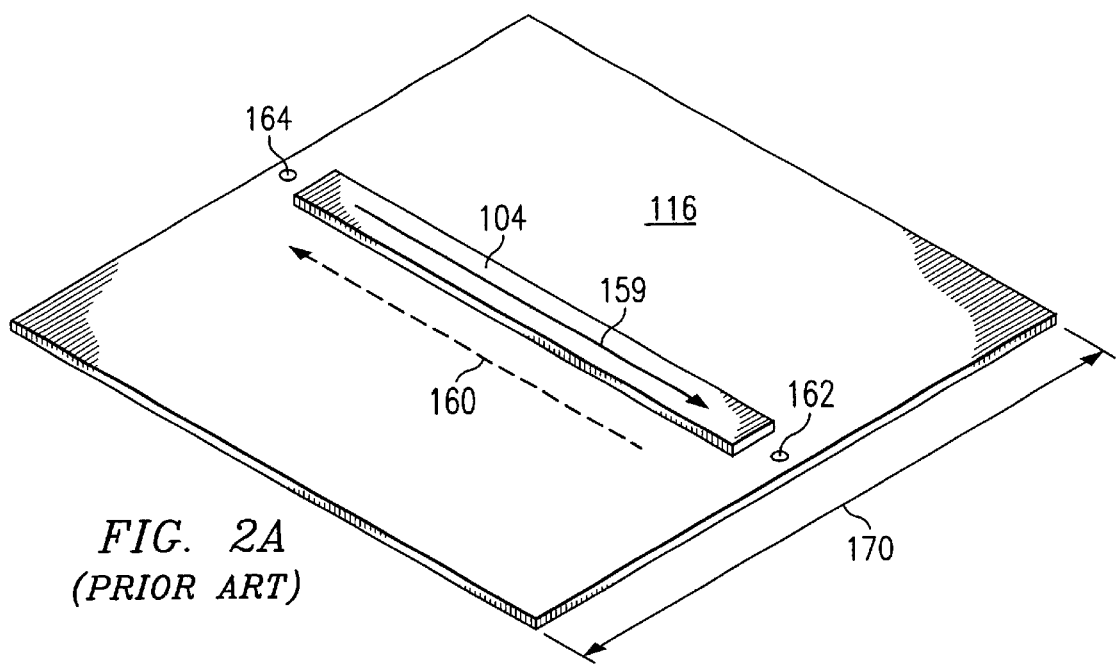
FIG. 2A depicts an isolated perspective view of metallic conducting plane 116 and metallic trace 104.
Figure 2B:
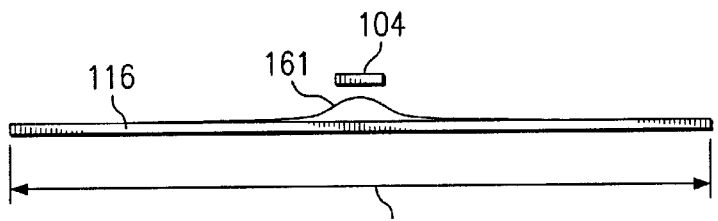
FIG. 2B illustrates an example of distribution 161 of return current 160 on conducting plane 116.
Figure 5:
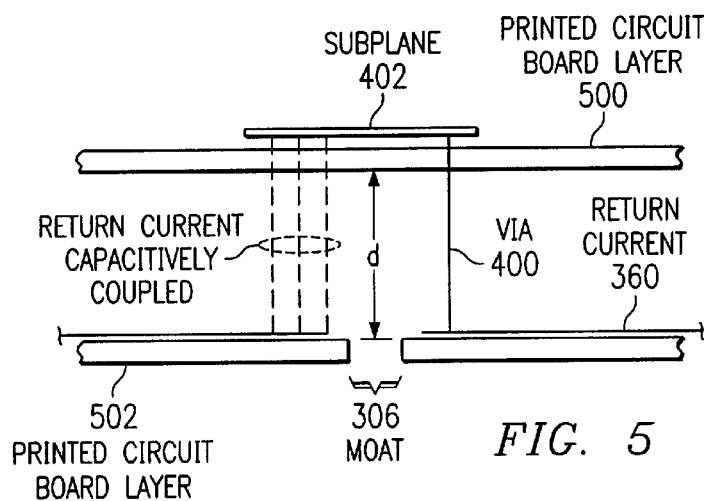
FIG. 5 shown is a plan (side) view of the structure depicted in FIG. 4.
Figure 3:
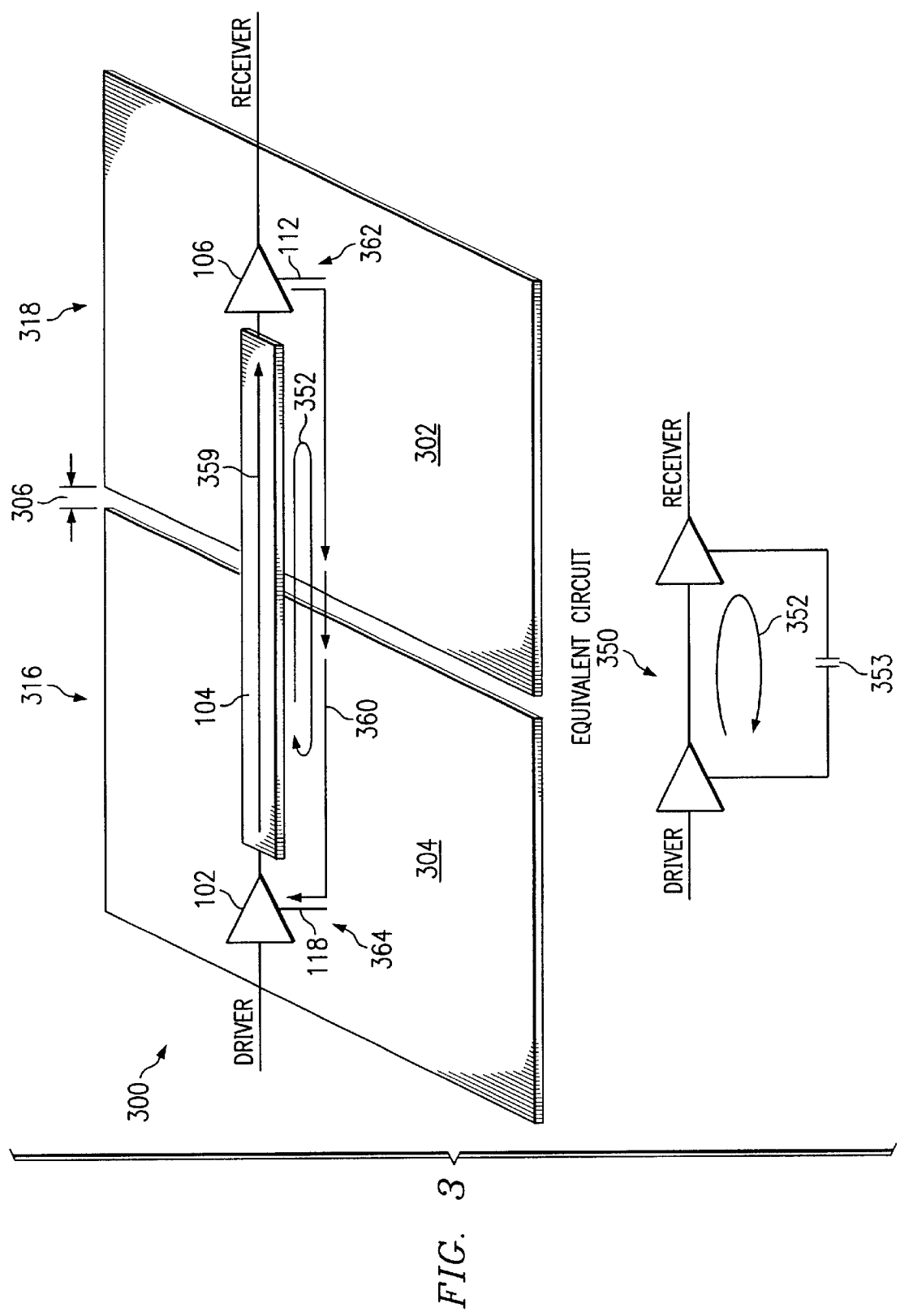
FIG. 3 shows a modified version of multilayer printed circuit board structure 154, referred to as multilayer printed circuit board structure 300, which is structurally similar to printed circuit board structure 154 except that the conducting plane is shown broken into first metallic conducting part 302 and second metallic conducting part 304, thereby forming split conducting plane 316.

Referring now to FIG. 5, shown is a plan (side) view of the structure depicted in FIG. 4. Illustrated is that conductive subplane 402 sits atop printed circuit board layer 500, which is also the printed circuit board layer upon which metallic trace 104 (not shown) sits. Also illustrated is gap d, which gives rise to the capacitive coupling between conductive subplane 402 and second metallic conducting part 304 of split conducting plane 316 atop printed circuit board layer 502. It is to be understood that conductive subplane 452 and first metallic conducting part 302 of split conducting plane 316 would appear similar to the foregoing structures if depicted in plan view.

While the foregoing figures have shown various embodiments, additional embodiments include implementing conductive subplanes, respectively coupled to first metallic conducting part 302 and second metallic conducting part 304 of split conducting plane 316, on layers of printed circuit boards other than the layer in which metallic trace 104 (which causes a current in split conductive plane 316) is located, which will allow a decrease in gap d and thus an increase in capacitance, consequently allowing a decrease in impedance generated by the structures. In addition, it should also be understood that there is no reason why conductive subplanes 400 and 452 must both be located on the same printed circuit board layer, and in other embodiments conductive subplanes 400 and 452 are located on two different printed circuit board layers.

Figure 6:
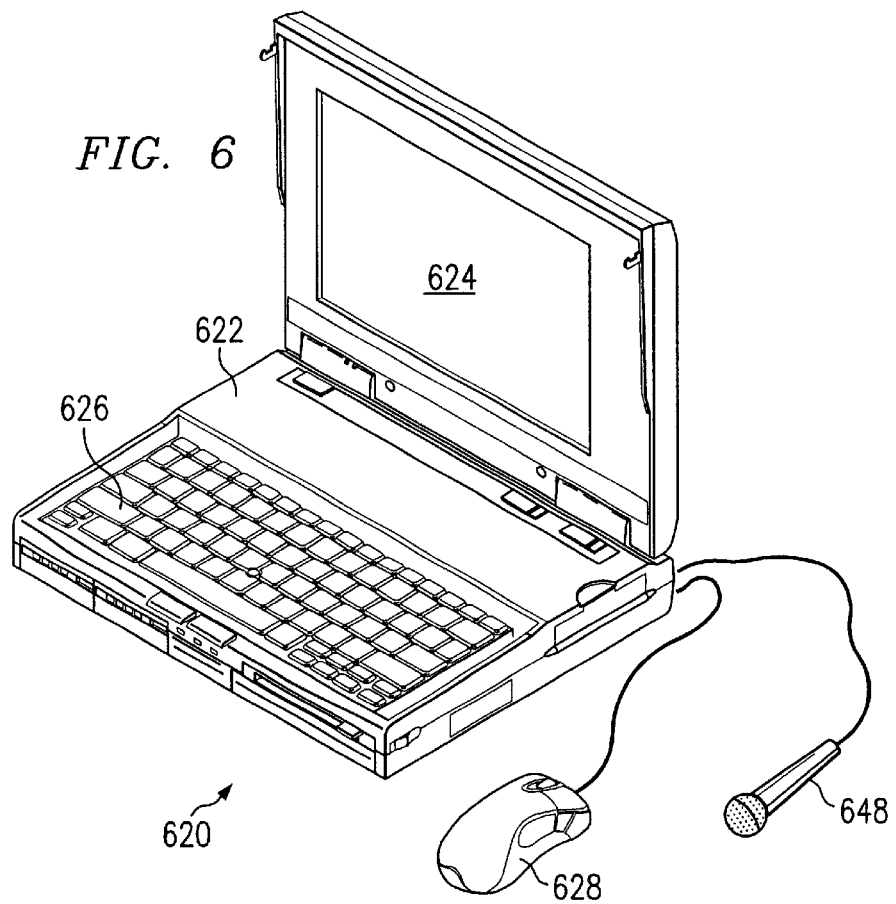
FIG. 6 depicts a pictorial representation of a conventional data processing system which can be utilized in accordance with an illustrative embodiment of the printed-circuit-board structures described above.

With reference now to FIG. 6, depicted is a pictorial representation of a conventional data processing system which can be utilized in accordance with an illustrative embodiment of the printed-circuit-board structures described above. It should be noted that a graphical user interface systems (e.g., Microsoft Windows 98 or Microsoft Windows NT operating systems) and methods can be utilized with the data processing system depicted in FIG. 6. Data processing system 620 is depicted which includes system unit housing 622, video display device 624, keyboard 626, mouse 628, and microphone 648. Data processing system 620 may be implemented utilizing any suitable computer such as those sold by Dell Computer Corporation, located in Round Rock, Texas. Dell is a trademark of Dell Computer Corporation.

Figure 7:
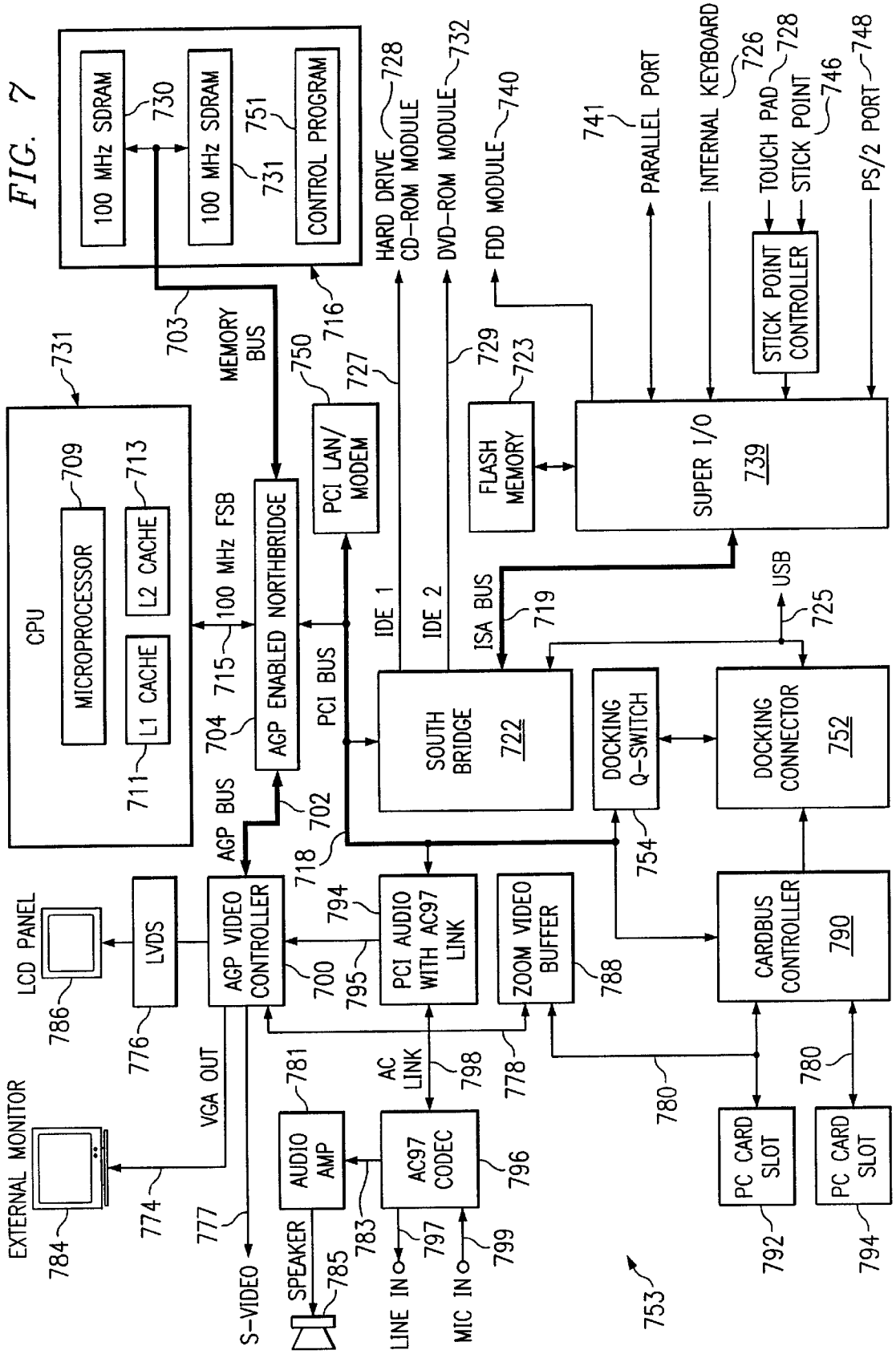
FIG. 7 depicts data processing system motherboard 753 having selected components of data processing system 620 in which illustrative embodiments of the printed-circuit-board structures described herein may be implemented (for example, by using the embodiments described herein where other board design constraints result in a multilayer printed circuit board having at least one split conducting plane).

Referring now to FIG. 7, depicted is data processing system motherboard 753 having selected components of data processing system 620 in which illustrative embodiments of the printed-circuit-board structures described herein may be implemented (for example, by using the embodiments described herein where other board design constraints result in a multilayer printed circuit board having at least one split conducting plane). Data processing system 620 includes Central Processing Unit ("CPU") 731 (wherein are depicted microprocessor 709, L1 Cache 711, and L2 Cache 713). CPU 731 is coupled to CPU bus 715.

CPU bus 715 is coupled to AGP-enabled Northbridge 704, which serves as a "bridge" between CPU bus 715, AGP interconnect (or bus) 702 (a type of data bus), and system memory bus 703. In going from one type of bus to another type of bus, a "bridge" is generally needed because the two different type buses speak a different "language." The term "AGP-enabled" is intended to mean that the so-referenced components are engineered such that they interface and function under the standards defined within the AGP interface specification (Intel Corporation, *Accelerated Graphics Port Interface Specification*).

Generally, each bus in a system utilizes an independent set of protocols (or rules) to conduct data, which are generally set forth in a product specification uniquely tailored to the type of bus in question (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 704, as well as the Southbridge 722, in that it is to be understood that such bridges can translate and coordinate between various data buses and/or devices which communicate through the bridges.

AGP interconnect 702 interfaces with AGP-enabled video controller 700, which respectively interconnects with video display devices external monitor 784 and LCD (Liquid Crystal Display) panel 786 (each of which are specific illustrations of the more general video display device 624) through VGA (Video Graphics Array) out) 774 and LVDS (Low Voltage Differential Signaling) bus 776. AGP-enabled video controller 700 also is depicted with S-Video out jack 777. AGP-enabled video controller 700 also is depicted as interconnected with zoom video buffer 788 via zoom video buffer bus 778. Zoom video buffer 788 is illustrated as interconnected with cardbus controller 790 via cardbus controller lines 780. Shown is that Cardbus controller lines 780 connect Cardbus controller 790 with PCI card slots 792 and 794.

Shown is that AGP-enabled video controller 700 interconnects with PCI audio w/AC97 link 794 via PCI audio-AGP video bus 795. Depicted is that PCI audio w/AC97 link 794 interconnects with AC97 CODEC 796 via AC97 link 798. Illustrated is that AC97 CODEC 796 has line in jack 797 and mic in jack 799. Depicted is that AC97 CODEC 796 interfaces with audio amp 781 via AC97 CODEC-audio amp bus 783. Illustrated is that audio amp 781 drives speaker 1085.

AGP-enabled Northbridge 704 interfaces with system memory bus 703. System memory bus 703 interfaces with system memory 716, which can contain various types of memory devices such as SDRAM chips 730 and 731, but which also can contain DRAM, Rambus DRAM, and other type memory chips. In addition, shown for sake of illustration is that data processing system 620 includes control program 751 which resides within system memory 716 and which is executed and/or operated on by CPU 731. Control program 751 contains instructions that when executed on CPU 731 carries out application program (e.g., video conferencing software) operations.

AGP-enabled Northbridge 704 interfaces with Peripheral Component Interconnect (PCI) bus 718, upon which are shown PCI Input-Output (I/O) devices PCI LAN/modem card 750, PCI Audio w/AC97 link 794, cardbus controller 790, and docking Q switch 754 which is depicted as electrically connected with docking connector 752. Docking connector 752 is also shown electrically connected with cardbus controller 790 and universal serial bus (USB) 725.

Depicted is that Peripheral Component Interconnect (PCI) bus 718 interfaces with Southbridge 722.

Southbridge 722 serves as a bridge between PCI bus 718 and I/O (or ISA) bus 719, universal serial bus USB 725, and Integrated Drive Electronics (IDE)connectors 727 and 729, which respectively connect with hard drive CD-ROM module 728 and DVD-ROM module 732.

I/O bus 719 interfaces with super I/O controller 739. Further shown is that super I/O controller 739 connects devices flash memory 723, FDD (floppy disk drive) module 740, parallel port 741, internal keyboard 1026, mouse or touchpad 728, stick point 746, and PS/2 port 748 to I/O bus 719.

Data processing system 620 typically contains logic defining at least one graphical user interface, and any suitable machine-readable media may retain the graphical user interface, such as SDRAM 730, ROM, a magnetic diskette, magnetic tape, or optical disk. Any suitable operating system such as one having an associated graphical user interface (e.g., Microsoft Windows or Microsoft NT) may direct CPU 731. Other technologies can also be utilized in conjunction with CPU 731, such as touch-screen technology or human voice control.

Those skilled in the art will appreciate that the hardware depicted in FIG. 7 may vary for specific applications. For example, other peripheral devices such as optical disk media, audio adapters, video cameras such as those used in videoconferencing, or programmable devices, such as PAL or EPROM programming devices well-known in the art of computer hardware, and the like may be utilized in addition to or in place of the hardware already depicted.

Those skilled in the art will recognize that data processing system 620 can be described in relation to data processing systems which perform essentially the same functions, irrespective of architectures.

The foregoing components and devices are used herein as examples for sake of conceptual clarity. Thus, CPU 731 is utilized as an exemplar of any general processing unit, including but not limited to multiprocessor units; CPU bus 715 is utilized as an exemplar of any processing bus, including but not limited to multiprocessor buses; PCI devices attached to PCI bus 718 are utilized as exemplars of any input-output devices attached to any I/O bus; AGP Interconnect 702 is utilized as an exemplar of any graphics bus; AGP-enabled video controller 700 is utilized as an exemplar of any video controller; Northbridge 704 and Southbridge 722 are utilized as exemplars of any type of bridge; and PCI LAN/modem card 750 is used is intended to serve as an exemplar of any type of synchronous or asynchronous inputoutput card. Consequently, as used herein these specific exemplars are intended to be representative of their more general classes. Furthermore, in general, use of any specific exemplar herein is also intended to be representative of its class and the noninclusion of such specific devices in the foregoing list should not be taken as indicating that limitation is desired.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such intent is present. For example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements. In addition, even if a specific number of an introduced claim element is explicitly recited, those skilled in the art will recognize that such recitation should typically be interpreted to mean at least the recited number (e.g., the bare recitation of "two elements," without other modifiers, typically means at least two elements, or two or more elements).

What is claimed is:

1. A printed circuit board comprising:
   at least one conductive member having a first end electrically coupled to a first conductive structure, the first conductive structure partially forming a moat, and a second end capacitively coupled to a second conductive structure, said at least one conductive member substantially spanning the moat; and
   said at least one conductive member having at least a portion overhanging the second conductive structure, said second conductive structure partially forming the moat.

2. The printed circuit board of claim 1, wherein said first end is coupled to the first conductive structure by at least one conductive via.

3. The printed circuit board of claim 1 further comprises:
   said at least one conductive member is substantially located within a first plane and the first conductive structure is substantially located in a second plane not coplanar with the first plane.

4. The printed circuit board of claim 1, wherein said at least one conductive member resides on a first layer of a printed circuit board and said second conductive structure resides on a second layer of the printed circuit board.

5. The printed circuit board of claim 1, wherein said first conductive structure and the second conductive structure are substantially located within the same plane.

6. The printed circuit board of claim 1, wherein said at least one conductive member, the first conductive structure and the second conductive structure provide a return current path.

7. The printed circuit board of claim 1, wherein said at least one conductive member is substantially coplanar with a metallic trace.

8. The printed circuit board of claim 1, wherein the first conductive structure is substantially rectangular in shape.

9. The printed circuit board of claim 1, wherein the second conductive structure is substantially rectangular in shape.

10. The printed circuit board of claim 1, wherein said at least one conductive member is substantially rectangular in shape.

11. The printed circuit board of claim 1, wherein the moat is filled with substantially dielectric material.

12. The printed circuit board of claim 1, wherein said at least one conductive member, the first conductive structure and the second conductive structure provide a return current path.

13. A printed circuit board comprising:
    a first conductive member having a first end electrically coupled to a first conductive structure, the first conductive structure partially forming a moat and a second end capacitively coupled to a second conductive structure, said first conductive member substantially spanning the moat;
    said first conductive member having at least a portion overhanging the second conductive structure, said second conductive structure partially forming the moat;
    a second conductive member having a first end electrically coupled to the second conductive structure and a second end capacitively coupled to the first conductive structure; and
    said second conductive member having at least a portion overhanging the first conductive structure.

14. The printed circuit board of claim 13, wherein said first conductive member further includes:
    at least one conductive via.

15. The printed circuit board of claim 13, wherein said second conductive member further includes:
    at least one conductive via.

16. The printed circuit board of claim 13 further comprises:
    said first conductive member is substantially located within a first plane and the second conductive structure is substantially located in a second plane not coplanar with the first plane.

17. The printed circuit board of claim 16, wherein the first conductive structure is substantially located within the second plane.

18. The printed circuit board of claim 13 further comprises:
said second conductive member is substantially located within a first plane and the second conductive structure is substantially located in a second plane not coplanar with the first plane.

19. The printed circuit board of claim 18 wherein the first conductive structure second plane.

20. The printed circuit board of claim 13, wherein the first conductive member resides on a first layer of a printed circuit board and said second conductive structure resides on a second layer of the printed circuit board.

21. The printed circuit board of claim 13, wherein the second conductive member resides on a first layer of a printed circuit board and said second conductive structure resides on a second layer of the printed circuit board.

22. The printed circuit board of claim 13, wherein the second conductive member is substantially coplanar with a metallic trace.

23. The printed circuit board of claim 13, wherein the first conductive member is substantially coplanar with a metallic trace.

24. The printed circuit board of claim 13, wherein the first conductive member, the first conductive structure, the second conductive member and the second conductive structure provide a return current path.

25. A computer system comprising:
one or more printed circuit board components mounted on at least one printed circuit board, said one or more printed circuit board components selected from the group comprising a microprocessor, a memory, a graphics processor, and a communications adapter;
the at least one printed circuit board comprising
at least one conductive member having a first end electrically coupled to a first conductive structure, the first conductive structure partially forming a moat and a second end capacitively coupled to a second conductive structure, said at least one conductive member substantially spanning the moat; and
said at least one conductive member having at least a portion overhanging the second conductive structure, said second conductive structure partially forming the moat.

26. The computer system of claim 25, wherein said first end is coupled to the first conductive structure by at least one conductive via.

27. The computer system of claim 25, further comprises:
said at least one conductive member is substantially located within a first plane and the first conductive structure is substantially located in a second plane not coplanar with the first plane.

28. The computer system of claim 25, wherein said at least one conductive member resides on a first layer of a printed circuit board and said second conductive structure resides on a second layer of the printed circuit board.

29. The computer system of claim 27, wherein the second conductive structure is substantially located within the second plane.

30. The computer system of claim 28, wherein the first conductive structure resides on the second layer of a printed circuit board.

31. The computer system of claim 25, wherein said at least one conductive member is substantially coplanar with a metallic trace.

32. The computer system of claim 25, wherein said at least one conductive member, the first conductive structure and the second conductive structure provide a return current path.

33. A computer system comprising:
one or more printed circuit board components mounted on at least one printed circuit board, said one or more printed circuit board components selected from the group comprising a microprocessor, a memory, a graphics processor, and a communications adapter;
the at least one printed circuit board comprising:
a first conductive member having a first end electrically coupled to a first conductive structure, the first conductive structure partially forming a moat and a second end capacitively coupled to a second conductive structure, said first conductive member substantially spanning the moat;
said first conductive member having at least a portion overhanging the second conductive structure, said second conductive structure partially forming the moat;
a second conductive member having a first end electrically coupled to the second conductive structure and a second end capacitively coupled to the first conductive structure; and
said second conductive member having at least a portion overhanging the first conductive structure.

34. The printed circuit board of claim 33, wherein said first conductive member further includes:
at least one conductive via.

35. The printed circuit board of claim 33, wherein said second conductive member further includes:
at least one conductive via.

36. The computer system of claim 33 further comprises:
said first conductive member is substantially located within a first plane and the second conductive structure is substantially located in a second plane not coplanar with the first plane.

37. The computer system of claim 36, wherein the first conductive structure is substantially located within the second plane.

38. The computer system of claim 33 further comprises:
said second conductive member is substantially located within a first plane and the second conductive structure is substantially located in a second plane not coplanar with the first plane.

39. The printed circuit board of claim 38, wherein the first conductive structure is substantially located within the second plane.

40. The computer system of claim 33, wherein the first conductive member resides on a first layer of a printed circuit board and said second conductive structure resides on a second layer of the printed circuit board.

41. The computer system of claim 33, wherein the second conductive structure resides on a first layer of a printed circuit board and said first conductive structure resides on a second layer of the printed circuit board.

42. The computer system of claim 33, wherein the second conductive member is substantially coplanar with a metallic trace.

43. The computer system of claim 33, wherein the first conductive structure is substantially coplanar with a metallic trace.

44. The computer system of claim 33, wherein the first conductive member, the first conductive structure, the second conductive member and the second conductive structure provide a return current path.

* * * * *